US006845341B2

(12) United States Patent
Beverly et al.

(10) Patent No.: US 6,845,341 B2
(45) Date of Patent: Jan. 18, 2005

(54) METHOD AND MECHANISM FOR IMPROVED PERFORMANCE ANALYSIS IN TRANSACTION LEVEL MODELS

(75) Inventors: Aaron Beverly, Los Gatos, CA (US);
Franco Carbognani, Calci (IT);
Shampa Gupta, San Jose, CA (US);
Prakash Parikh, Newark, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/396,768

(22) Filed: Mar. 24, 2003

(65) Prior Publication Data

US 2004/0054500 A1 Mar. 18, 2004

Related U.S. Application Data

(63) Continuation of application No. 10/217,941, filed on Aug. 12, 2002, now abandoned.
(60) Provisional application No. 60/387,074, filed on Jun. 7, 2002, and provisional application No. 60/380,395, filed on May 14, 2002.

(51) Int. Cl.[7] .............................................. G06F 7/02
(52) U.S. Cl. ...................... 702/182; 702/183; 702/189; 702/190
(58) Field of Search ........................ 702/177, 179–183, 702/189; 703/14; 714/739; 716/4

(56) References Cited

U.S. PATENT DOCUMENTS

| | | | |
|---|---|---|---|
| 5,668,732 A | 9/1997 | Khouja et al. | 364/483 |
| 5,953,519 A | 9/1999 | Fura | 395/500.19 |
| 6,075,932 A | 6/2000 | Khouja et al. | 395/500.05 |
| 6,163,763 A | 12/2000 | Cox et al. | 703/17 |
| 6,182,258 B1 | 1/2001 | Hollander | 714/739 |
| 6,347,388 B1 | 2/2002 | Hollander | 714/739 |
| 6,470,482 B1 * | 10/2002 | Rostoker et al. | 716/6 |
| 6,530,054 B2 * | 3/2003 | Hollander | 714/739 |
| 6,581,191 B1 * | 6/2003 | Schubert et al. | 716/4 |
| 6,618,839 B1 * | 9/2003 | Beardslee et al. | 716/4 |

OTHER PUBLICATIONS

Ferrari, Alberto et al., "Design and Implementation of Dual Processor Platform for Power–train Systems", Proceedings of the 2000 International Congress on Transportation Electronics, Oct. 2000, pp. 325–331, Society of Automotive Engineers, Inc., Warrendale, PA.

Baliani, M. et al., "HW/SW Codesign of an Engine Management System", Proceeding of Design, Automation and Test in Europe Conference, Mar. 2000, Munich, DE.

Ferrari, Alberto et al., "System Design: Traditional Concepts and New Paradigms", Proceedings of the 1999 Int. Conf. on Comp. Des., Oct. 1999, Austin.

(List continued on next page.)

Primary Examiner—Marc S. Hoff
Assistant Examiner—Felix Suarez
(74) Attorney, Agent, or Firm—Bingham McCutchen LLP

(57) ABSTRACT

A method and mechanism for performing improved performance analysis upon transaction level models. A system block may be modeled using transaction model at different levels of abstraction. A testbench may be used to apply a set of stimuli to a transaction model (e.g. a TLM model) and a RTL equivalent model, and store the resulting timing information into a database. The timing information stored in the database may be used to validate the performance of the transaction models and system block. The testbench may analyze transaction models in the TLM domain and the RTL domain through the employment of TVM (transaction verification models) which are components that maps the transaction-level requests made by a test stimulus generator to a detailed signal-level protocol on the RTL design.

33 Claims, 7 Drawing Sheets

OTHER PUBLICATIONS

Chang, Henry et al., "Surviving the SOC Revolution, A Guide to Platform–Based Design", 1999, Kluwer Academic Publishers, Norwell, MA.

Clouard, Alain et al., "Towards Bridging the Precision Gap Between SOC Transactional and Cycle–Accurate Levels", Design, Automation and Test in Europe Conference, Munich, Mar. 2002.

Carbognani, Franco et al., "Qualifying Precision of Abstract SystemC Models Using the SystemC Varification Standard", ACM/SIGDA Date '03, Munich, Germany, Mar. 3–7, 2003.

Schirrmeister, Frank et al., "Virtual Component Co–Design—Facilitating a Wn–Win Relationship between IP Integrators and IP Providers", IP Conference, Edinburgh, Nov. 1999.

Siegmund, Robert et al., "SystemC$^{sv}$: An Extension of SystemC for Mixed Multi–Level Communication Modeling and Interface–Based System Design", IEEE, 2001.

De La Torre, E. et al., "Model Generation of Test Logic for Macrocell Based Designs", IEEE, 1996.

PCT International Search Report, International Application No. PCT/US03/15344, Aug. 8, 2003.

* cited by examiner

METHOD AND MECHANISM FOR IMPROVED PERFORMANCE ANALYSIS IN TRANSACTION LEVEL MODELS

RELATED APPLICATION DATA

This application is a continuation of U.S. Appl. Ser. No. 10/217,941, filed on Aug. 12, 2002 now abandoned, which claims priority to U.S. provisional application Ser. No. 60/380,395 filed on May 14, 2002 and U.S. provisional application Ser. No. 60/387,074 filed on Jun. 7, 2002, all of which are incorporated herein by reference in their entirety.

FIELD OF THE INVENTION

The invention generally relates to the field of system level design, and more particularly, to performing improved performance analysis on transaction models.

BACKGROUND AND SUMMARY OF THE INVENTION

Advances in silicon technology increasingly allow larger and more complex designs to be formed on a single chip. Components on a chip may be organized into system blocks. A system block is a model of a component on a chip, e.g., a CPU, a bus, or a timer. Designs may consist of millions or tens of millions of transistors on a single chip. At the same time, however, market demands continue to push designers to develop designs more rapidly and efficiently. As a result, designers strive to increase the performance of system blocks, which may be measured by characteristics such as timing and accuracy.

A transaction is a discrete operation on the signal level, e.g., writing one or more bytes from CPU to memory. Models for processing transactions ("transaction models"), operating at different levels of abstraction, may be used by a system designer in designing and testing system blocks. In general, the level of abstraction of a model is inversely proportional to the accuracy of the model and directly proportional to the speed of simulation of the models. In other words, as the level of abstraction increases, the speed of simulation increases while the accuracy decreases.

The design of a system block may initially be tested using a transaction model, such as a TLM model. Subsequently, the design of the system block may be tested and validated at lower levels of abstraction, e.g., via a RTL equivalent model. Transaction models operating at a high-level of abstraction shall be referred to as TLM (transaction level modeling) models. Transaction level modeling refers to a high-level approach to modeling digital systems where communication among modules are separated from the details of the implementation of the functional units. TLM models operating at a high-level of abstraction may have a corresponding model operating at a low-level of abstraction, such as a RTL (register transfer level) model. Register transfer level refers to the level of abstraction at which a digital system is described as synchronous transfer between functional units.

A testbench may be used in the testing and validation of the system blocks using transaction models. A testbench, in this context, is an application that may apply a set of stimuli (such as a test vector) to a model to produce a set of information used in analyzing the timing or performance of a system block. One non-limiting, illustrative example of a tool capable of operating on a TLM model is the Virtual Component Co-design ("VCC") tool available from Cadence Design Systems located in San Jose, Calif. A non-limiting, illustrative example of a tool capable of operating upon a RTL equivalent model is the NC-Sim tool available from Cadence Design Systems located in San Jose, Calif.

It is advantageous that the transaction models to be as accurate as possible to aid the system designer. The validation of the transaction models involves not only accessing how accurate the TLM model is compared with the RTL equivalent model, but also where the tradeoffs lie with respect to simulation speed and accuracy. In the prior art, the performance of transaction models have not been validated against RTL equivalent models because the transaction models have been primarily built to showcase the capabilities of the testbench, which is undesirable because it undermines the accuracy of the performance of the transaction model. Additionally, the validation of TLM models with respect to their RTL equivalent models are performed on a case-by-case basis. In other words, a TLM model is validated first, and then the corresponding RTL equivalent models is validated independently of the TLM model. There currently exists no mechanism for testing and validating TLM models against their RTL equivalent models using the same set of stimuli. As the two worlds (between the TLM models and the RTL models) are completely disconnected, separate testbenches are required to test the TLM models and the RTL equivalent models. Using separate testbenches for testing models of different levels of abstraction prevents accurate comparisons between the models.

The disconnect between the TLM models and the RTL equivalent models produces even further problems in the art. Both TLM models and the RTL equivalent models are used to test the timing and duration of transactions in the system block. The timing of the same transaction using a TLM model and a RTL equivalent model generally may not match, because the TLM model may be cycle approximate, while the RTL equivalent model may be cycle accurate. In a cycle accurate model, accurate cycle counts are available for each transaction that is processed. Events that occur during the processing of a transaction are indicated with precision as to which clock cycle they occur in. On the other hand, in a cycle approximate model, only approximate cycle counts are available for events occurring during transaction processing because the model is not complete as to every aspect, e.g., modeling of pipelining and cache effects may not be completely accurate. Accordingly, it is difficult to account for discrepancies detected in the duration or timing of a transaction between the TLM model and a corresponding RTL equivalent model because the differences between the testing and validation environments between the high-level of abstraction and low-level of abstraction is compounded by an inability to accurately align clock cycles. Accordingly, there is a need in the art for improved performance analysis in transaction level models Accordingly, the present invention provides for improved method for effecting performance analysis upon a system block. In an embodiment, a system block is modeled in both a TLM model and a RTL equivalent model. Next, a testbench generates a set of stimuli, where the testbench is an application that may apply the set of stimuli against the TLM model or the RTL equivalent model to produce a set of timing information. Thereafter, performance analysis is effected on the TLM model using the set of stimuli, and performance analysis is effected on the RTL equivalent model using the set of stimuli. Further details of aspects, objects, and advantages of the invention are described below in the detailed description, drawings, and claims.

BRIEF DESCRIPTION OF DRAWINGS(S)

The present invention is illustrated by way of example, and not by way of limitation, in the figures of the accompanying drawings and in which like reference numerals refer to similar elements and in which.

DETAILED DESCRIPTION OF EMBODIMENT(S)

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Figure 1A:
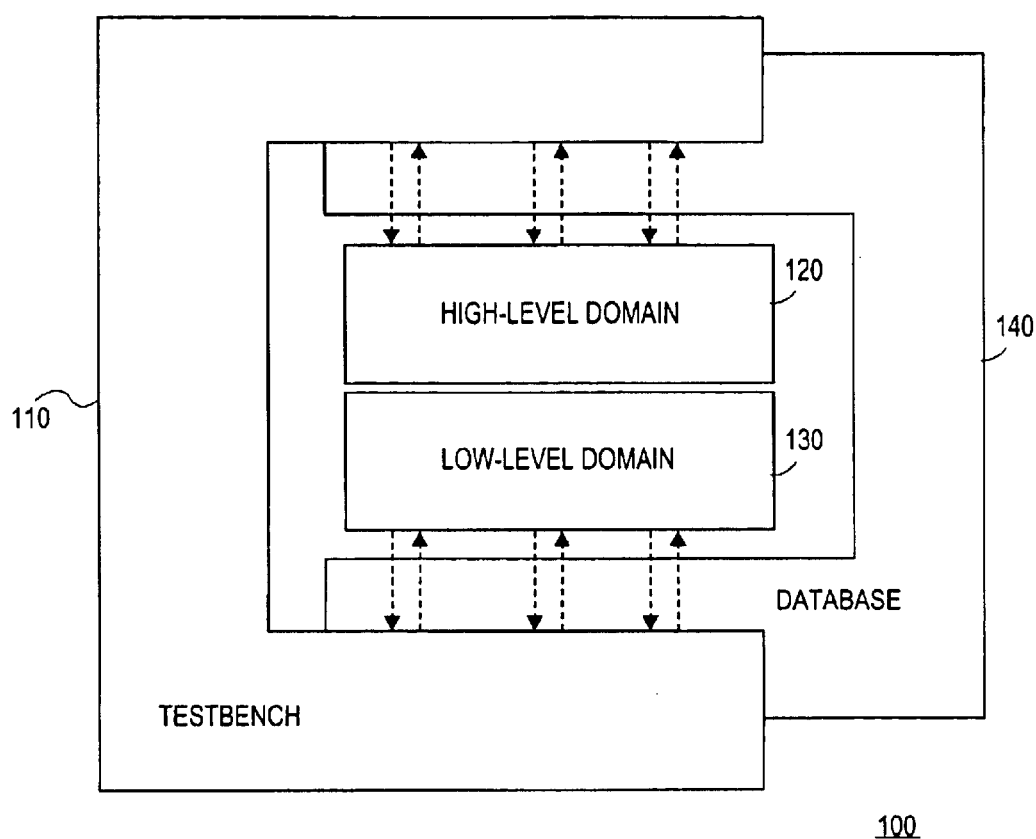
FIG. 1A is a first graphical illustration of a performance validation system 100 according to an embodiment of the invention.

Embodiments of the invention advantageously provide for performing improved transaction timing analysis through the employment of a performance validation system 100. FIG. 1A is a graphical illustration of a performance validation system 100 according to an embodiment of the invention. As FIG. 1A shows, the performance validation system 100 comprises a testbench 110, a high-level domain 120, a low-level domain 130, and a database 140. Each of the testbench 110, high-level domain 120, low-level domain 130, and database 140 are operatively connected to one another. In other words, information may be transferred between each of the components of the performance validation system 100.

The testbench 110 is an application that applies a set of stimuli (such as a test vector) to a transaction model to produce a set of information used in analyzing the timing or performance of a system block. The set of stimuli applied to the testbench may include one or more transactions. In the performance validation system 100, the testbench 110 may apply the same set of stimuli to both the high-level domain 120 and the low-level domain 130. In an embodiment, the testbench 110 may be constructed using an object-oriented programming language, e.g., C++.

The high-level domain 120 is a processing entity that operates upon one or more transaction models to produce timing information useful in analyzing the timing and duration of transactions. In an embodiment, the transaction models utilized by the high-level domain 120 may be TLM models. In an embodiment, TLM blocks of the high-level domain 120 may be implemented using a programming language, e.g., C++ or SystemC. The low-level domain 130 is a processing entity that operates upon RTL equivalent models to produce timing information useful in analyzing the timing and duration of transactions.

The database 140 may be any operational component known to those skilled in the art for persisting and storing data in an organized manner. For example, database 140 may be any commercial database, a set of one or more files, or other types of mechanisms for persisting digital information. In the performance validation system 100, the database 140 stores timing information for high-levels models and low-level models.

Figure 1B:
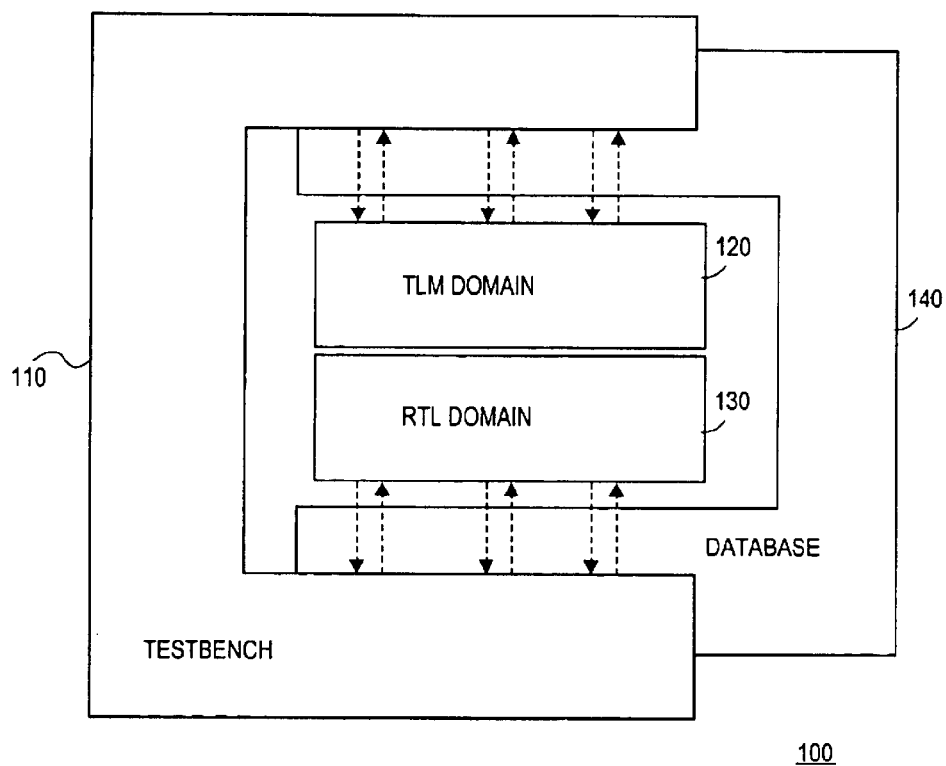
FIG. 1B is a second graphical illustration of a performance validation system 100 according to an embodiment of the invention.

FIG. 1B is another graphical illustration of a performance validation system 100 according to an embodiment of the invention. As FIG. 1B shows, in an embodiment, the high-level domain 120 may be referred to as a TLM domain 120, and the low-level domain 130 may be referred to as the RTL domain 130. For ease of explanation, the following description of the high-level domain 120 and low-level domain 130 shall be made with reference to the TLM domain 120 and the RTL domain 130 respectively, in conformance with FIG. 1B. It is contemplated that the TLM domain 120 shall encompass any processing entities that operate upon TLM models to produce timing information useful in analyzing the timing and duration of transactions, and it is contemplated that the RTL domain 130 shall encompass any processing entities that operate upon RTL equivalent models to produce timing information useful in analyzing the timing and duration of transactions The steps in the high-level process flow of the performance validation system 100 shall now be described according to an embodiment of the invention. Initially, the testbench generates a set of stimuli to be applied to a TLM model or a RTL equivalent model. The testbench 110 transmits the set of stimuli to either the TLM domain 120 to test a TLM model or to the RTL domain 130 to test a RTL equivalent model. The same set of stimuli may be provided to the TLM domain 120 and the RTL domain 130 because the TLM domain 120 and the RTL domain 130 may translate the set of stimuli once it has been received. Subsequently, the TLM domain 120 or the RTL domain 130 processes the set of stimuli against a transaction model, producing timing information which is recorded in the database 140. The timing information stored in the database 140 includes information about the timing and duration of each transaction in the set of stimuli as it was processed by a transaction model. In other words, the TLM domain 120 stores timing information in the database 140 about transactions processed using a TLM model, and the RTL domain 130 stores timing information in the database 140 about transactions processed using a RTL equivalent model.

Timing information stored in the database 140 may be used to validate the transaction models. In embodiments of the invention, analysis may be performed on the timing information stored in the database using applications external to the testbench 110, e.g., SimVision and Transaction Explorer, both of which are available from Cadence Design Systems of San Jose, Calif., although it is contemplated that this functionality may also be provided through the testbench 110 in other embodiments. Timing information stored within the database 140 facilitates meaningful comparisons between models of different levels of abstraction because the timing information is based upon the same set of stimuli and the timing information is transaction based and model independent. In some cases, the timing information for a transaction is not stored separately for models of different levels of abstraction, rather it is stored centrally and may be meaningfully compared for each transaction between transaction models and their RTL equivalents. In other cases, statistical computation may also be required before meaningfully comparisons between models of different levels of abstraction may be performed.

Figure 2:
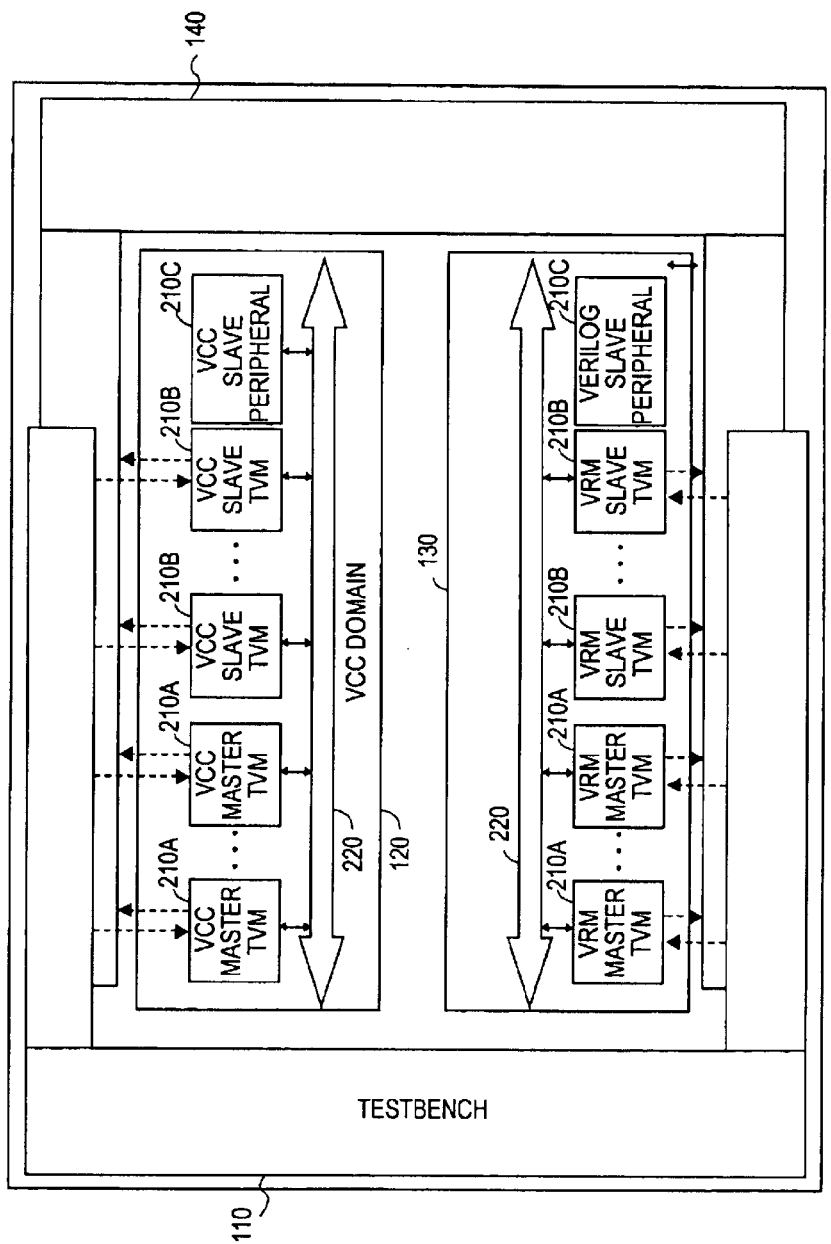
FIG. 2 is a graphical illustration of a performance validation system 100 comprising TVMs 210 according to an embodiment of the invention.

The TLM domain 120 and the RTL domain 130 each may comprise sub-components used in processing the set of stimuli. In an embodiment, the TLM domain 120 and the RTL domain 130 include one or more TVMs 210 and a bus 220. FIG. 2 is a graphical illustration of a performance validation system 100 comprising TVMs 210 according to an embodiment of the invention. A TVM 210 (transaction verification model) is a component that maps the transaction-level requests made by a test stimulus generator to a detailed signal-level protocol on the RTL design. The mapping process entails for instance a conversion from the "type" field set to read or write operation in a particular transaction to a value that asserts the equivalent read/write signal at the RTL level for the same transaction. A bus 220 is a communication pathway well understood to those skilled in the art through which information may be sent. For example, the bus 220 may pass data between various TVMs 210 (e.g., between a master TVM 210A and a slave TVM 210B). A TVM 210 may have knowledge on how to translate the set of stimuli into a format usable by the TVM 210.

A particular TVM 210 maybe one of a variety of types of TVMs 210. For example, as FIG. 2 illustrates, a particular TVM 210 may be a master TVM 210A, a slave TVM 210B, or a slave peripheral TVM 210C. A master TVM 210A is a TVM 210 that models the component responsible for initiating processing of a transaction. Accordingly, a master TVM 210A may initially process each transaction. A non-limiting illustrative example of a master TVM 210A include the AMBA (AHB, APB and APBif) TVMs 210A (not shown). A slave TVM 210B is a TVM that assists a master TVM 210A in processing a transaction. Accordingly, some transactions may not need a slave TVM 210B for the transaction to be fully processed. A non-limiting illustrative example of the sub-component a slave TVM 210B would model includes a memory block (not shown). There is generally a master TVM 210A and/or slave TVM 210B for each sub-component of a system block. If a particular slave 210B is not available for a sub-component of a system block, a slave peripheral TVM 210C may be used. A slave peripheral TVM 210C is a generic slave TVM 210B. Non-limiting, illustrative examples of the types of sub-components that may be modeled by a slave peripheral TVM 210C include memory, caches, and bridges. Typically, a master TVM 210A may begin the processing of a transaction, and subsequently transmit information to a slave TVM 210B for processing. It is possible that a particular transaction may only require the use of a master TVM 210A, and to not need a slave TVM 210B or a slave peripheral TVM 210C to complete processing of a transaction, particularly in the VCC domain 220.

Figure 3:
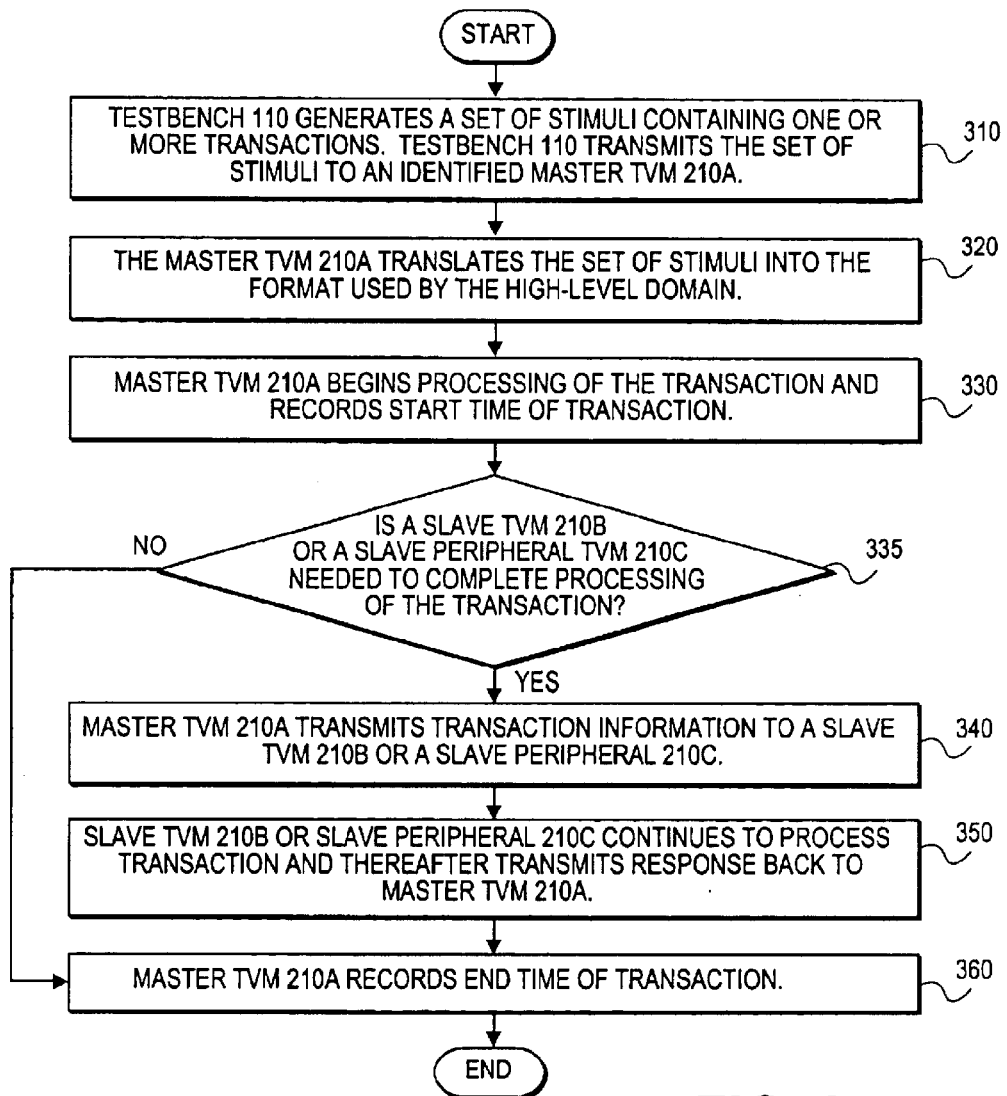
FIG. 3 is a flow-chart illustrating the sequence of steps in performance analysis in the TLM domain 220 according to an embodiment of the invention.

FIG. 3 is a flow-chart illustrating the sequence of steps in effecting performance analysis in the TLM domain 120 according to an embodiment of the invention. Initially, in step 310, the testbench 110 generates a set of stimuli containing one or more transactions. The testbench 110 may identify an appropriate master TVM 210A in the TLM domain 120 to process the set of stimuli, and subsequently transmit the set of stimuli to the identified master TVM 210A in the TLM domain 120. Next, in step 320, the master TVM 210A translates the set of stimuli into a format used by TVMs 210 in the TLM domain 120. Thereafter, in step 330, the master TVM 210A begins processing the transaction. Instep 330, the master TVM 210A records the start time of the transaction by storing the time in which the transaction started in the database 140. Additional information about the transaction may also be stored in the database 140 contemporaneously with the start time.

In step 335, the master TVM 210A determines if a slave TVM 210B or a slave peripheral TVM 210C in the TLM domain 120 may be needed to assist the processing of the transaction. In performing step 335, a slave peripheral TVM 210C may only be considered if a slave TVM 210B is not available for the appropriate component to continue processing the transaction. If the determination of step 335 is negative, then processing proceeds to step 360. If the determination of step 335 is positive, then the master TVM 210A may transmit information about the transaction being processed over the bus 220 to the slave TVM 210B or slave peripheral 210C in step 340. After the slave TVM 210B or slave peripheral 210C receives the information about the transaction being processed in step 340, the slave TVM 210B or slave peripheral 210C continues to process the transaction. Thereafter, in step 340, once processing is complete, the slave TVM 210B or slave peripheral 210C may transmit a verification message to the master TVM 210A over the bus 220 indicating that the transaction has been processed. Once the master TVM 210A receives the verification message, processing proceeds to step 360. In step 360, the master TVM 210C records an end time for the transaction in the database 140. Additional information about the transaction may also be stored in the database 140 contemporaneously with the end time.

Figure 4:
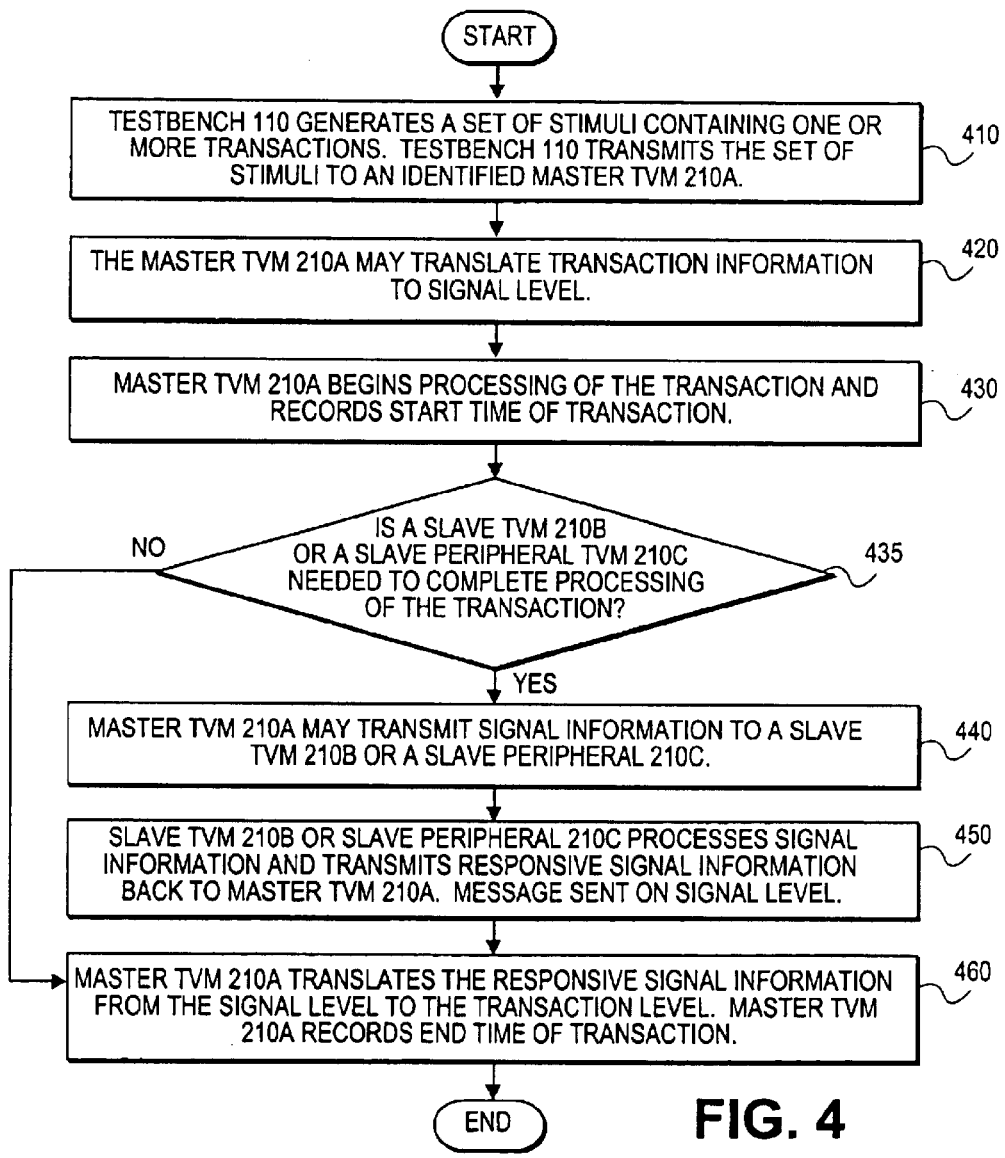
FIG. 4 is a flow-chart illustrating the sequence of steps in performance analysis in the RTL domain 230 according to an embodiment of the invention.

FIG. 4 is a flow-chart illustrating the sequence of steps in effecting performance analysis in the RTL domain 130 according to an embodiment of the invention. Initially, in step 410, the testbench 110 generates a set of stimuli containing one or more transactions. The testbench 110 may identify an appropriate master TVM 210A in the RTL domain 130 to process the set of stimuli, and subsequently transmit the set of stimuli to the identified master TVM 210A. Next, in step 420, the master TVM 210A may translate transaction information to the signal level. Thereafter, in step 430, the master TVM 210A begins processing the transaction. In step 430, the master TVM 210A records the start time of the transaction by storing the time in which the transaction started in the database 140. Additional information about the transaction may also be stored in the database 140 contemporaneously with the start time.

In step 435, the master TVM 210A determines if a slave TVM 210B or a slave peripheral TVM 210C in the RTL domain 130 may be needed to assist the processing of the transaction. If the determination of step 435 is negative, then processing proceeds to step 460. If the determination of step 435 is positive, then the master TVM 210A transmits transaction signal information to the slave TVM 210B or slave peripheral 210C in step 440. After the slave TVM 2101B or slave peripheral 210C receives the information about the transaction being processes in step 440, the slave TVM 210B or slave peripheral 210C translates the information from the signal level to the transaction level, and thereafter continues to process the transaction.

Thereafter, in step 450, once processing is complete, the slave TVM 210B or slave peripheral 210C may notify the master TVM 210A over the bus 220 that the transaction has been processed. Once the master TVM 210A receives the acknowledgement from the slave TVM 201B or the slave peripheral 210C that the transaction has been processed, processing proceeds to step 460. In step 460, the master TVM 210C records an end time for the transaction in the database 140. Additional information about the transaction may also be stored in the database 140 contemporaneously with the end time.

Figure 5:
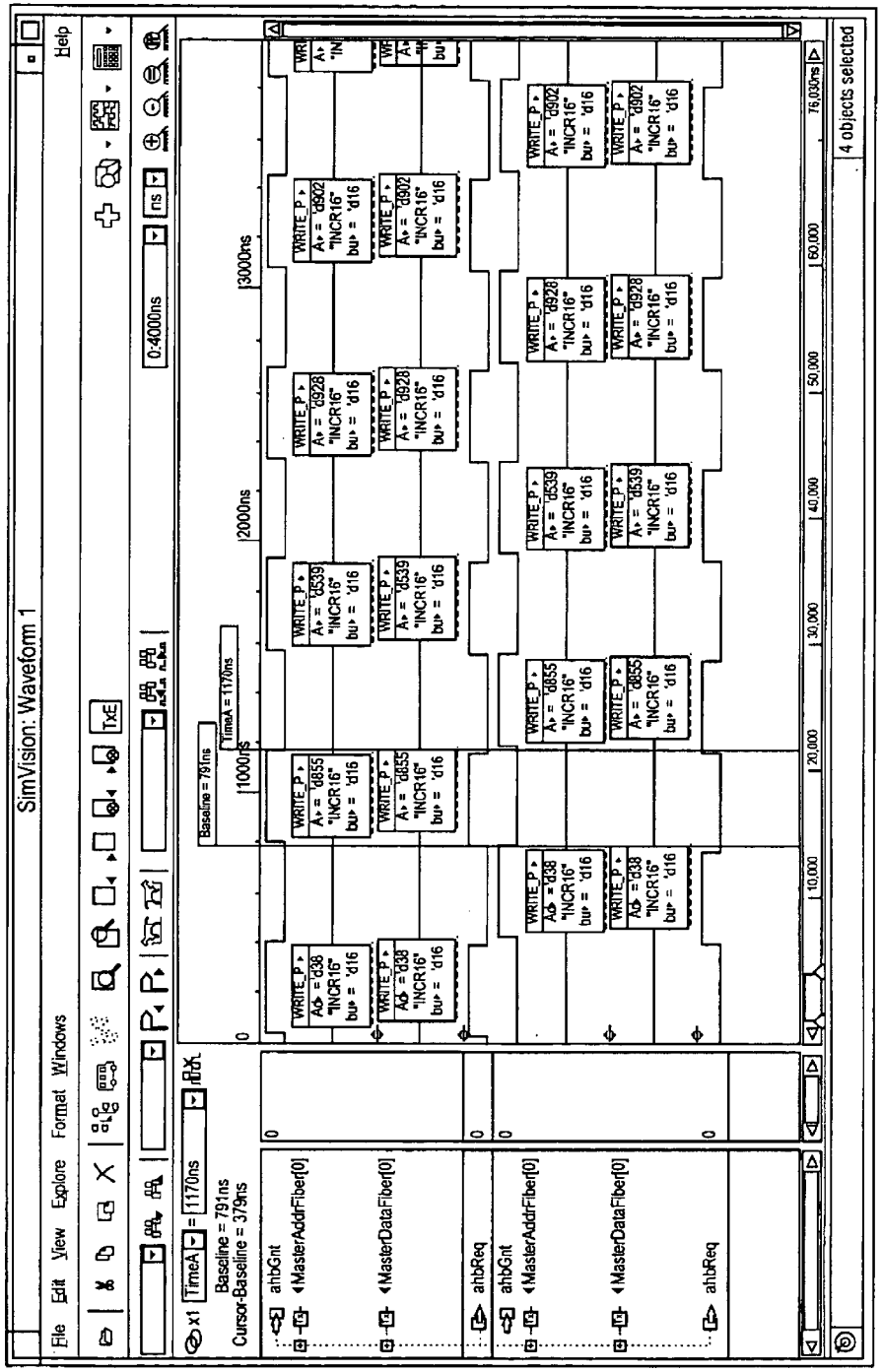
FIG. 5 is a graphical illustration of performance analysis on transactions according to an embodiment of the invention.

FIG. 5 is a graphical illustration of timing analysis performed on transactions according to an embodiment of the invention. A user interface may be used to display the timing information stored in the database 140, e.g., SimVision available from Cadence Design Systems, located in San Jose, Calif. For example, using a user interface as shown in FIG. 5, the start time, end time, and duration of transactions processed according to different levels of abstraction may be displayed. Using such tools, a transaction model may be validated against the RTL equivalent model. If any discrepancies are detected, the detailed information about the timing of the transactions may be used to improve the accuracy of the high-level and/or low-level abstraction models.

The execution of the sequences of instructions required to practice the invention may be performed in embodiments of the invention by a computer system 600. In an embodiment of the invention, execution of the sequences of instructions required to practice the invention is performed by a single computer system 600. According to other embodiments of the invention, two or more computer systems 600 coupled by a communication link 615 may perform the sequence of instructions required to practice the invention in coordination with one another. In order to avoid needlessly obscuring the invention, a description of only one computer system 600 will be presented below; however, it should be understood that any number of computer systems 600 may be employed to practice the invention.

Figure 6:
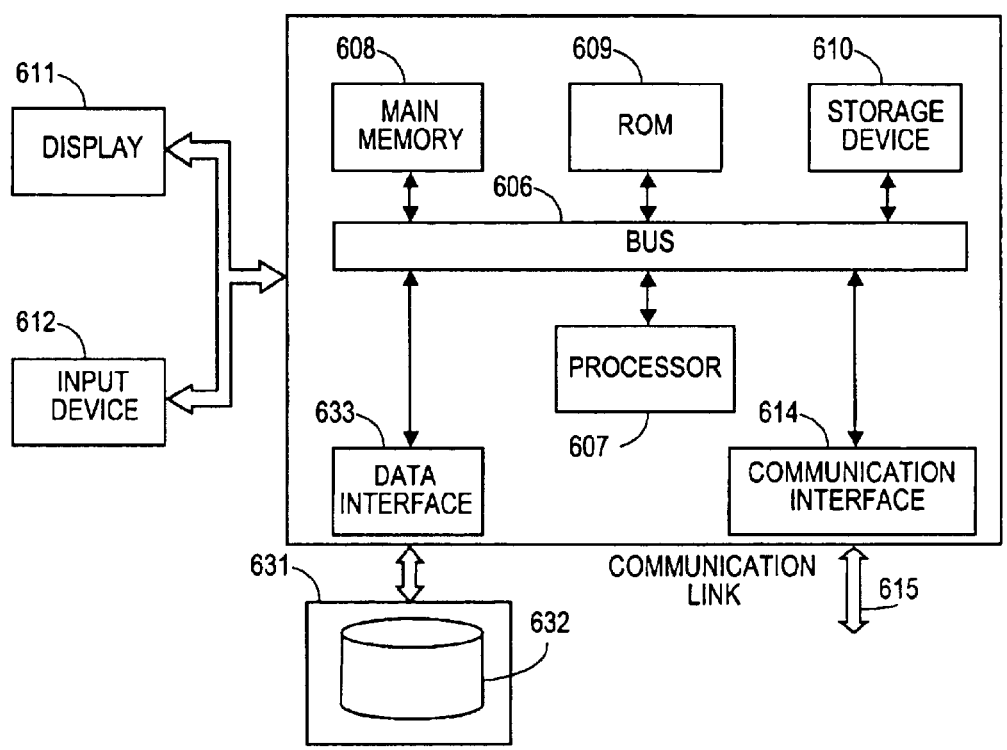
FIG. 6 is a block diagram of the functional components of a computer system 600 according to an embodiment of the invention.

A computer system 600 according to an embodiment of the invention will now be described with reference to FIG. 6, which is a block diagram of the functional components of a computer system 600 according to an embodiment of the invention. As used herein, the term computer system 600 is broadly used to describe any computing device that can store and independently run one or more programs.

Each computer system 600 may include a communication interface 614 coupled to the bus 606. The communication interface 614 provides two-way communication between computer systems 600. The communication interface 614 of a respective computer system 600 transmits and receives electrical, electromagnetic or optical signals, that include data streams representing various types of signal information, e.g., instructions, messages and data. A communication link 615 links one computer system 600 with another computer system 600. For example, the communication link 615 may be a LAN, in which case the communication interface 614 may be a LAN card, or the communication link 615 may be a PSTN, in which case the communication interface 614 may be an integrated services digital network (ISDN) card or a modem.

A computer system 600 may transmit and receive messages, data, and instructions, including programs, i.e., application code, through its respective communication link 615 and communication interface 614. Received program code may be executed by the respective processor(s) 607 as it is received, and/or stored in the storage device 610, or other associated non-volatile media, for later execution.

In an embodiment, the computer system 600 operates in conjunction with a data storage system 631, e.g., a data storage system 631 that contains a database 632 that is readily accessible by the computer system 600. The computer system 600 communicates with the data storage system 631 through a data interface 633. A data interface 633, which is coupled to the bus 606, transmits and receives electrical, electromagnetic or optical signals, that include data streams representing various types of signal information, e.g., instructions, messages and data. In embodiments of the invention, the functions of the data interface 633 may be performed by the communication interface 614.

Computer system 600 includes a bus 606 or other communication mechanism for communicating instructions, messages and data, collectively, information, and one or more processors 607 coupled with the bus 606 for processing information. Computer system 600 also includes a main memory 608, such as a random access memory (RAM) or other dynamic storage device, coupled to the bus 606 for storing dynamic data and instructions to be executed by the processor(s) 607. The main memory 608 also may be used for storing temporary data, i.e., variables, or other intermediate information during execution of instructions by the processor(s) 607.

The computer system 600 may further include a read only memory (ROM) 609 or other static storage device coupled to the bus 606 for storing static data and instructions for the processor(s) 607. A storage device 610, such as a magnetic disk or optical disk, may also be provided and coupled to the bus 606 for storing data and instructions for the processor(s) 607.

A computer system 600 may be coupled via the bus 606 to a display device 611, such as, but not limited to, a cathode ray tube (CRT), for displaying information to a user. An input device 612, e.g., alphanumeric and other keys, is coupled to the bus 606 for communicating information and command selections to the processor(s) 607.

According to one embodiment of the invention, an individual computer system 600 performs specific operations by their respective processor(s) 607 executing one or more sequences of one or more instructions contained in the main memory 608. Such instructions may be read into the main memory 608 from another computer-usable medium, such as the ROM 609 or the storage device 610. Execution of the sequences of instructions contained in the main memory 608 causes the processor(s) 607 to perform the processes described herein. In alternative embodiments, hard-wired circuitry may be used in place of or in combination with software instructions to implement the invention. Thus, embodiments of the invention are not limited to any specific combination of hardware circuitry and/or software.

The term "computer-usable medium," as used herein, refers to any medium that provides information or is usable by the processor(s) 607. Such a medium may take many forms, including, but not limited to, non-volatile, volatile and transmission media. Non-volatile media, i.e., media that can retain information in the absence of power, includes the ROM 609, CD ROM, magnetic tape, and magnetic discs. Volatile media, i.e., media that can not retain information in the absence of power, includes the main memory 608. Transmission media includes coaxial cables, copper wire and fiber optics, including the wires that comprise the bus 606. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense.

What is claimed is:

1. A method for effecting performance analysis upon a system block, comprising:
    modeling the system block in both a TLM model and a RTL equivalent model;
    generating a set of stimuli at a testbench to be applied against both the TLM model and the RTL equivalent model;
    using the set of stimuli to effect performance analysis on both the TLM model and the RTL equivalent model.

2. The method of claim 1, wherein using the set of stimuli to effect performance analysis on the TLM model comprises storing a set of timing information for the TLM model in a database, and wherein using the set of stimuli to effect performance analysis on the RTL equivalent model comprises storing a set of timing information for the RTL equivalent model in the database.

3. The method of claim 2, further comprising:
    analyzing the timing information to determine the accuracy of the TLM model compared to the RTL equivalent model.

4. The method of claim 3, wherein analyzing the timing information is performed using an application external to the testbench.

5. The method of claim 1, where using the set of stimuli to effect performance analysis on the TLM transaction model comprises:
    receiving the set of stimuli at a first transaction verification model, the set of stimuli comprising one or more transactions;
    converting the set of stimuli into a format readable by the first transaction verification model;
    recording a first set of timing information in a database for a particular transaction in the set of one or more transactions, the first set of timing information comprising a start time for the particular transaction;
    processing the particular transaction; and
    recording a second set of timing information for the particular transaction in the database, the second set of timing information comprising an end time for the particular transaction.

6. The method of claim 5, wherein processing the particular transaction comprises:
    determining if a second transaction verification model is needed to complete processing of the particular transaction;
    transmitting information corresponding to the particular transaction to the second transaction verification model;
    processing the particular transaction at the second transaction verification model; and
    notifying the first transaction verification model that the second transaction verification model has finished processing the transaction.

7. The method of claim 1, wherein using the set of stimuli to effect performance analysis on the RTL equivalent model comprises:
    receiving the set of stimuli at a first transaction verification model, the set of stimuli comprising one or more transactions;
    converting the set of stimuli into a format readable by the first transaction verification model;
    recording in a database a first set of timing information for a particular transaction in the set of one or more transactions, the first set of timing information comprising a start time;
    processing the particular transaction; and
    recording a second set of timing information for the particular transaction in the database, the second set of timing information comprising an end time.

8. The method of claim 7, wherein converting the set of stimuli into a format readable by the first transaction verification model comprises translating the set of stimuli from a transaction level to a signal level.

9. The method of claim 7, wherein processing the particular transaction comprises:
  determining if a second transaction verification model is needed to complete processing of the particular transaction;
  transmitting information corresponding to the particular transaction to the second transaction verification model, wherein the information being transmitted corresponds to a signal level;
  processing the particular transaction at the second transaction verification model; and
  receiving a response back from the second transaction verification model at the first transaction verification model indicting the particular transaction has finished processing at the second transaction verification model.

10. The method of claim 1, wherein the TLM model is cycle approximate and the RTL equivalent model is cycle accurate.

11. The method of claim 1, wherein using the set of stimuli to effect performance analysis on both the TLM model and the RTL equivalent model is performed at the testbench.

12. A computer-readable medium carrying one or more sequences of instructions for effecting performance analysis upon a system block, wherein execution of the one or more sequences of instructions by one or more processors causes the one or more processors to perform a method comprising:
  modeling the system block in both a TLM model and a RTL equivalent model;
  generating a set of stimuli at a testbench to be applied against both the TLM model and the RTL equivalent model;
  using the set of stimuli to effect performance analysis on both the TLM model and the RTL equivalent model.

13. The computer-readable medium of claim 12, wherein using the set of stimuli to effect performance analysis on the TLM model comprises storing a set of timing information for the TLM model in a database, and wherein using the set of stimuli to effect performance analysis on the RTL equivalent model comprises storing a set of timing information for the RTL equivalent model in the database.

14. The computer-readable medium of claim 13, further comprising:
  analyzing the timing information to determine the accuracy of the TLM model compared to the RTL equivalent model.

15. The computer-readable medium of claim 14, wherein analyzing the timing information is performed using an application external to the testbench.

16. The computer-readable medium of claim 12, wherein using the set of stimuli to effect performance analysis on the TLM transaction model comprises:
  receiving the set of stimuli at a first transaction verification model, the set of stimuli comprising one or more transactions;
  converting the set of stimuli into a format readable by the first transaction verification model;
  recording a first set of timing information in a database for a particular transaction in the set of one or more transactions, the first set of timing information comprising a start time for the particular transaction;
  processing the particular transaction; and
  recording a second set of timing information for the particular transaction in the database, the second set of timing information comprising an end time for the particular transaction.

17. The computer-readable medium of claim 16, wherein processing the particular transaction comprises:
  determining if a second transaction verification model is needed to complete processing of the particular transaction;
  transmitting information corresponding to the particular transaction to the second transaction verification model;
  processing the particular transaction at the second transaction verification model; and
  notifying the fist transaction verification model that the second transaction verification model has finished processing the transaction.

18. The computer-readable medium of claim 12, wherein using the set of stimuli to effect performance analysis on the RTL equivalent model comprises:
  receiving the set of stimuli at a first transaction verification model, the set of stimuli comprising one or more transactions;
  converting the set of stimuli into a format readable by the first transaction verification model;
  recording in a database a first set of timing information for a particular transaction in the set of one or more transactions, the first set of timing information comprising a start time;
  processing the particular transaction; and
  recording a second set of timing information for the particular transaction in the database, the second set of timing information comprising an end time.

19. The computer-readable medium of claim 18, wherein converting the set of stimuli into a format readable by the first transaction verification model comprises translating the set of stimuli from a transaction level to a signal level.

20. The computer-readable medium of claim 18, wherein processing the particular transaction comprises:
  determining if a second transaction verification model is needed to complete processing of the particular transaction;
  transmitting information corresponding to the particular transaction to the second transaction verification model, wherein the information being transmitted corresponds to a signal level;
  processing the particular transaction at the second transaction verification model; and
  receiving a response back from the second transaction verification model at the fist transaction verification model indicting the particular transaction has finished processing at the second transaction verification model.

21. The computer-readable medium of claim 12, wherein the TLM model is cycle approximate and the RTL equivalent model is cycle accurate.

22. The computer-readable medium of claim 12, wherein using the set of stimuli to effect performance analysis on both the TLM model and the RTL equivalent model is performed at the testbench.

23. An apparatus for effecting performance analysis upon a system block, comprising:
  means for modeling the system block in both a TLM model and a RTL equivalent model;

means for generating a set of stimuli at a testbench to be applied against both the TLM model and the RTL equivalent model;

means for using the set of stimuli to effect performance analysis on both the TLM model and the RTL equivalent model.

24. The apparatus of claim 23, wherein said means for using the set of stimuli to effect performance analysis on both the TLM model and the RTL equivalent model comprises means for storing a set of timing information for the TIM model in a database, and means for storing a set of timing information for the RTL equivalent model in the database.

25. The apparatus of claim 24, further comprising:

means for analyzing the timing information to determine the accuracy of the TLM model compared to the RTL equivalent model.

26. The apparatus of claim 25, wherein said means for analyzing the timing information comprises means for using an application external to the testbench.

27. The apparatus of claim 23, wherein said means for using the set of stimuli comprises means for effecting performance analysis on the TLM transaction model, comprising:

means for receiving the set of stimuli at a first transaction verification model, the set of stimuli comprising one or more transactions;

means for converting the set of stimuli into a format readable by the first transaction verification model;

means for recording a first set of timing information in a database for a particular transaction in the set of one or more transactions, the first set of timing information comprising a start time for the particular transaction;

means for processing the particular transaction; and means for recording a second set of timing information for the particular transaction in the database, the second set of timing information comprising an end time for the particular transaction.

28. The apparatus of claim 27, wherein said means for processing the particular transaction comprises:

means for determining if a second transaction verification model is needed to complete processing of the particular transaction;

means for transmitting information corresponding to the particular transaction to the second transaction verification model;

means for processing the particular transaction at the second transaction verification model; and means for notifying the first transaction verification model that the second transaction verification model bas finished processing the transaction.

29. The apparatus of claim 23, wherein said means for using the set of stimuli comprises means for effecting performance analysis on the RTL equivalent model, comprising:

means for receiving the set of stimuli at a first transaction verification model, the set of stimuli comprising one or more transactions;

means for converting the set of stimuli into a format readable by the first transaction verification model;

means for recording in a database a first set of timing information for a particular transaction in the set of one or more transactions, the first set of timing information comprising a start time;

means for processing the particular transaction; and means for recording a second set of timing information for the particular transaction in the database, the second set of timing information comprising an end time.

30. The apparatus of claim 27, wherein said means for converting the set of stimuli into a format readable by the first transaction verification model comprises means for translating the set of stimuli from a transaction level to a signal level.

31. The apparatus of claim 27, wherein said means for processing the particular transaction comprises:

means for determining if a second transaction verification model is needed to complete processing of the particular transaction;

means for transmitting information corresponding to the particular transaction to the second transaction verification model, wherein the information being transmitted corresponds to a signal level;

means for processing the particular transaction at the second transaction verification model; and means for receiving a response back from the second transaction verification model at the first transaction verification model indicting the particular transaction has finished processing at the second transaction verification model.

32. The apparatus of claim 23, wherein the TLM model is cycle approximate and the RTL equivalent model is cycle accurate.

33. The apparatus of claim 23, wherein said means for using the set of stimuli to effect performance analysis on both the TLM model and the RTL equivalent model comprises means for performing the performance analysis at the testbench.

* * * * *